(12) United States Patent  (10) Patent No.: US 9,007,839 B2
Lee et al.  (45) Date of Patent: Apr. 14, 2015

(54) NONVOLATILE MEMORY DEVICE PERFORMING READ OPERATION WITH VARIABLE READ VOLTAGE

(71) Applicant: Samsung Electronics Co., Ltd., Suwon-Si, Gyeonggi-Do (KR)

(72) Inventors: Ji-Sang Lee, Jeollabuk-Do (KR); Moosung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/915,688

(22) Filed: Jun. 12, 2013

(65) Prior Publication Data

US 2014/0010017 A1  Jan. 9, 2014

(30) Foreign Application Priority Data

Jul. 6, 2012 (KR) .................. 10-2012-0073979

(51) Int. Cl.
*G11C 11/34* (2006.01)
*G11C 16/26* (2006.01)
*G11C 11/56* (2006.01)
*G11C 16/34* (2006.01)

(52) U.S. Cl.
CPC ............ *G11C 16/26* (2013.01); *G11C 11/5642* (2013.01); *G11C 16/3454* (2013.01); *G11C 16/3495* (2013.01)

(58) Field of Classification Search
CPC ...... G11C 16/26; G11C 16/349; G11C 11/15; G11C 11/5642; G11C 16/10; G11C 2207/068
USPC ................. 365/158, 171, 185.18, 185.2, 236, 365/185.03, 185.09, 185.22, 185.29, 189.07
See application file for complete search history.

(56) References Cited

U.S. PATENT DOCUMENTS

| 7,257,668 | B2 | 8/2007 | Chan et al. |
| 7,505,318 | B2 | 3/2009 | Fukuda et al. |
| 7,715,232 | B2 | 5/2010 | Kim et al. |
| 7,904,674 | B2 | 3/2011 | Kojo et al. |
| 8,019,928 | B2 | 9/2011 | Lasser |
| 8,024,509 | B2 | 9/2011 | Lasser |
| 8,107,291 | B2 | 1/2012 | Kim et al. |
| 8,284,603 | B2 | 10/2012 | Park et al. |
| 2009/0310404 | A1 * | 12/2009 | Cho et al. .................. 365/185.2 |
| 2010/0149869 | A1 | 6/2010 | Kim et al. |

FOREIGN PATENT DOCUMENTS

KR  1020090011170 A  2/2009

* cited by examiner

*Primary Examiner* — Thong Q Le
(74) *Attorney, Agent, or Firm* — Volentine & Whitt, PLLC

(57) ABSTRACT

A method of reading a nonvolatile memory device comprises applying a read voltage to a memory cell array to read selected memory cells, counting a number of the selected memory cells that have a threshold voltage higher or lower than the read voltage, and comparing the counted number with a reference value to determine a number of bits stored in the selected memory cells.

19 Claims, 8 Drawing Sheets

NONVOLATILE MEMORY DEVICE PERFORMING READ OPERATION WITH VARIABLE READ VOLTAGE

CROSS-REFERENCE TO RELATED APPLICATIONS

This application claims priority under 35 U.S.C. §119 to Korean Patent Application No. 10-2012-0073979 filed Jul. 6, 2012, the subject matter of which is hereby incorporated by reference.

BACKGROUND OF THE INVENTION

The inventive concept relates generally to nonvolatile memory devices. More particularly, certain embodiments of the inventive concept relate to a nonvolatile memory device that performs read operations using a variable read voltage.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM) and dynamic random access memory (DRAM), and examples of nonvolatile memory devices include flash memory devices and read only memory (ROM).

Among nonvolatile memories, flash memory devices have gained increasing popularity in recent years due to attractive features such as relatively low cost, high storage capacity, low power consumption, fast access speed, and an ability to withstand physical shock. Flash memory devices can be broadly categorized as NOR type and a NAND type according to the layout of their memory cells and bit lines. A NOR type flash memory has a layout in which two or more cell transistors are connected to a single bit line. In the NOR type flash memory, data is stored by channel hot electron injection and erased by Fowler-Nordheim tunneling. A NAND type flash memory may have a layout in which two or more cell transistors are connected in series to a bit line. In the NOR type flash memory, data is stored and erased by Fowler-Nordheim tunneling.

Memory cells of a flash memory may store 1-bit data or multi-bit data, depending on the memory's design. Where a memory cell stores 1-bit data, it may have a threshold voltage corresponding to one of two threshold voltage states representing data "1" and data "0". Where a memory cell stores 2-bit data, it may have a threshold voltage corresponding to one of four threshold voltage states representing data "11", "10", etc. Where a memory cell stores 3-bit data, it may have a threshold voltage corresponding to one of eighth threshold voltage states representing data "111", "110", etc.

In general, memory cells storing different numbers of bits may use different voltage levels to perform read operations. Moreover, a particular set of memory cells may be used alternatively to store 1-bit data or multi-bit data. Accordingly, it may be necessary to determine the read voltages to be used in different read operations according to the current configuration of a memory device.

SUMMARY OF THE INVENTION

In one embodiment of the inventive concept, a method of reading a nonvolatile memory device comprises applying a read voltage to a memory cell array to read selected memory cells, counting a number of the selected memory cells that have a threshold voltage higher or lower than the read voltage, and comparing the counted number with a reference value to determine a number of bits stored in the selected memory cells.

In another embodiment of the inventive concept, a method of reading a nonvolatile memory device comprises performing a read operation on data programmed in a first logical page corresponding to a page address, the read operation comprising counting a number of memory cells having a threshold voltage higher than a first read voltage among selected memory cells to produce a first counting result and determining a number of bits programmed in the selected memory cells by comparing the first counting result with a first reference value, and performing a read operation on data programmed in a second logical page corresponding to a page address, the read operation comprising counting memory cells having a threshold voltage lower than a second read voltage among the selected memory cells to produce a second counting result and determining a number of bits programmed in the selected memory cells by comparing the second counting result with a second reference value. The second read voltage is lower than the first read voltage, the first reference value is determined on the basis of the number of memory cells having a threshold voltage higher than the first read voltage among memory cells of a first logical page programmed, and the second reference value is determined on the basis of the number of memory cells having an erase state among memory cells of the first logical page programmed and a second logical page programmed.

In yet another embodiment of the inventive concept, a nonvolatile memory device comprises a memory cell array comprising a plurality of memory cells, a page buffer configured to read data from the memory cell array or to write data in the memory cell array, a counter configured to count on cells or off cells among selected memory cells using data read via the page buffer, judge logic configured to compare a result of the counting performed by the counter with a reference value, and control logic configured to control a read voltage used in a read operation according to the comparison performed by the judge logic, wherein the off cells are memory cells having respective threshold voltages higher than a first read voltage, the on cells are memory cells having respective threshold voltages lower than a second read voltage, and the second read voltage is lower than the first read voltage.

These and other embodiments of the inventive concept can potentially eliminate a need to use flag cells to indicate program states of selected memory cells, which can potentially improve reliability of stored data and increase data storage capacity.

BRIEF DESCRIPTION OF THE DRAWINGS

The drawings illustrate selected embodiments of the inventive concept. In the drawings, like reference numbers indicate like features.

DETAILED DESCRIPTION

Figure 1:
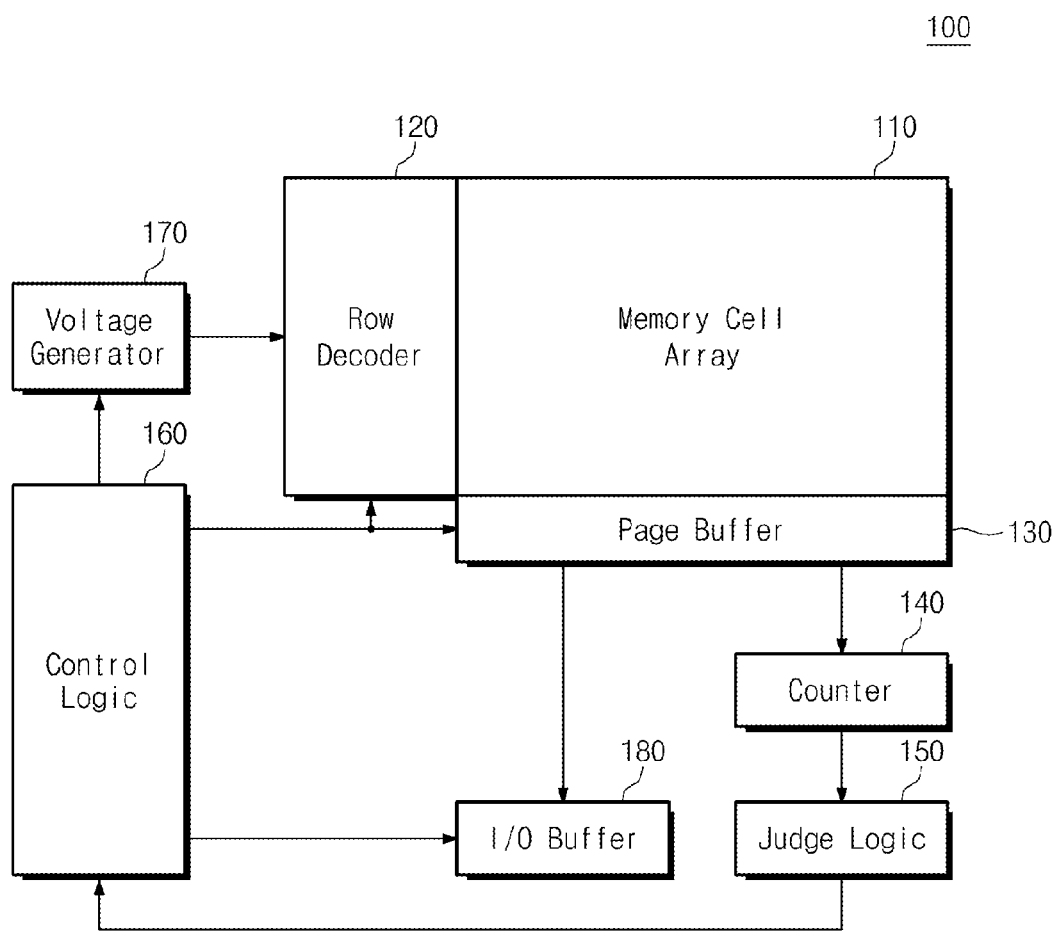
FIG. 1 is a block diagram illustrating a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features should not be limited by these terms. Rather, these terms are used merely to distinguish between different features. Thus, a first feature discussed below could be termed a second feature and vice versa, for example, without materially altering the meaning of the relevant description.

Spatially relative terms, such as "beneath", "below", "lower", "under", "above", "upper" and the like, may be used to describe one feature's relationship to another feature(s) as illustrated in the drawings. The spatially relative terms are intended to encompass different orientations of the device in use or operation in addition to the orientation depicted in the drawings. For example, if the device as shown in the drawings is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the inventive concept. As used herein, the singular forms "a", "an" and "the" are intended to include the plural forms as well, unless the context clearly indicates otherwise. The terms "comprises" and/or "comprising," where used in this specification, indicate the presence of stated features but do not preclude the presence or addition of one or more other features. As used herein, the term "and/or" encompasses any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory device 100 according to an embodiment of the inventive concept.

Referring to FIG. 1, nonvolatile memory device 100 comprises a memory cell array 110, a row decoder 120, a page buffer 130, a counter 140, judge logic 150, control logic 160, a voltage generator 170, and an input/output buffer 180. For explanation purposes, it will be assumed that nonvolatile memory device 100 is a NAND flash memory device. However, the inventive concept is not limited to NAND flash memory devices. For example, nonvolatile memory device 100 could alternatively be a NOR flash memory device, a resistive random access memory (RRAM), a phase change memory (PRAM), a magnetoresistive RAM (MRAM), or a ferroelectric RAM (FRAM).

Nonvolatile memory device 100 is configured to read data stored in memory cells corresponding to a page address provided from a controller (not shown). Memory cell array 110 comprises memory cells connected to bit lines and wordlines. Some of these memory cells comprise multi-level cells (MLCs) storing a plurality of bits using multiple threshold voltage distributions. In the description that follows, it will be assumed that the MLCs are 2-bit MLCs, although the inventive concept is not limited to 2-bit MLCs. In addition, it is assumed that randomized data is stored at memory cell array 110. The randomized data is produced by modifying input data supplied to memory device 110 from an external source, and it is used to program the memory cells with a substantially uniform distribution of threshold voltage states.

Row decoder 120 selects a wordline according to a page address and provides the selected wordline with a wordline voltage provided from voltage generator 170. In a program operation, row decoder 120 provides the selected wordline with a program voltage Vpgm (e.g., about 15V to 20V) and a verify voltage Vvfy, and it provides unselected wordlines with a program pass voltage Vpass. In a read operation, row decoder 120 provides the selected wordline with a read voltage Vrd, and it provides the unselected wordlines with a read pass voltage Vread (e.g., about 5V).

When performing a read operation, nonvolatile memory device 100 may use a first or second read voltage to read LSB data according to the number of bits stored in selected memory cells, as described below with respect to FIGS. 3 through 6. To determine whether to use the first or second read voltage, nonvolatile memory device may apply the first read voltage to the selected memory cells and then count the number of the selected memory cells that remain "off" (or alternatively, "on") in the presence of the first voltage, i.e., that have threshold voltages higher than the first voltage. Assuming that the selected memory cells store randomized data, the number of "off" cells will provide an indication of whether the selected memory cells store one or more bits of data, and therefore whether to perform a read operation with the second read voltage. Additionally, as described below with reference to FIGS. 3 and 4, a similar technique may be used to determine read voltages to be used when reading higher-order bit data, such as MSB data.

Page buffer 130 operates as a write driver or as a sense amplifier according to an operating mode of nonvolatile memory device 100, such as a read or write mode. For example, in a read operation, page buffer 130 may operate as a sense amplifier. In the read operation, page buffer 130 may read data from memory cell array 110 by a page unit. For example, page buffer 130 may read LSB page data or MSB page data corresponding to a page address from memory cell array 110.

Counter 140 counts the number of on cells or off cells among the selected memory cells based on data read by page buffer 130. For example, counter 140 may count "off" cells each having a threshold voltage higher than a first read voltage. In this case, data read by page buffer 130 may be data read by applying of the first read voltage. Alternatively, counter 140 may count "on" cells having a threshold voltage lower than a second read voltage. In this case, data read by page buffer 130 may be data read according to applying of the second read voltage. Counter 140 transfers a first result value indicating the number of "off" cells counted or a second result value indicating the number of "on" cells counted.

Judge logic 150 compares the first result value or the second result value provided from counter 140 with a reference value to determine whether the selected memory cells are programmed with one or more bits of data. For example, judge logic 150 may determine whether the selected memory cells store one bit of data by comparing the first result value with a first reference value or the second result value with a second reference value. Where the first result value is larger than the first reference value, the selected memory cells may be determined to store multi-bit data. Where the first result value is smaller than the first reference value, the selected memory cells may be determined to store one bit data. Where the second result value is smaller than the second reference value, the selected memory cells may be determined to store one bit data. Where the second result value is larger than the second reference value, the selected memory cells may be determined to store multi-bit data. Examples of the first and second reference values will be more fully described with reference to FIGS. 3 and 5.

Control logic 160 controls voltage generator 170 and page buffer 130 according to a result output by judge logic 150. In some embodiments, control logic 160 is configured to incorporate counter 140 and judge logic 150. Voltage generator 170 generates read voltages under control of control logic 160 and transfers the generated read voltages to row decoder 130. Input/output buffer 180 outputs data transferred from page buffer 130 under control of control logic 160.

In a conventional nonvolatile memory device, a flag cell may be used to indicate whether selected memory cells store one bit data or multi-bit data. In some instances, the flag cell may lose charge, which can result in read errors. Additionally, because the flag cells occupy a part of a memory cell array, they tend to reduce the amount of space available for storing other data. However, by using the above described mechanism, nonvolatile memory device 100 can determine the number of bits stored in selected memory cells without using flag cells. Therefore, it is possible to improve the reliability and the degree of integration.

Figure 2:
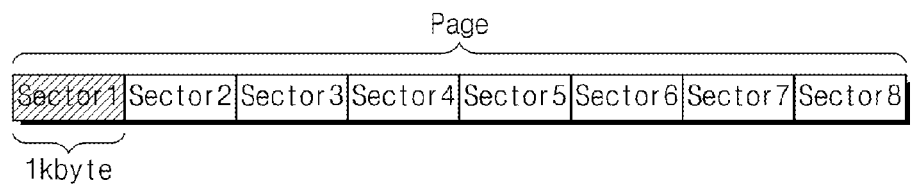
FIG. 2 is a diagram illustrating a page of data to which a read method may be applied according to an embodiment of the inventive concept.

FIG. 2 is a diagram illustrating a page of data to which a read method may be applied according to an embodiment of the inventive concept.

Referring to FIG. 2, a read method of a nonvolatile memory device may be performed with respect to an entire page or at least one sector in a page to determine program states of memory cells. One sector may have a size of 1 Kbyte, for example. FIG. 2 shows an example in which one page is formed of eight sectors. However, the inventive concept is not limited thereto. For example, a page can be formed of at least one sector. In general, the size of counter 140 may vary according to the number of selected memory cells on which the read method is performed.

Figure 3:
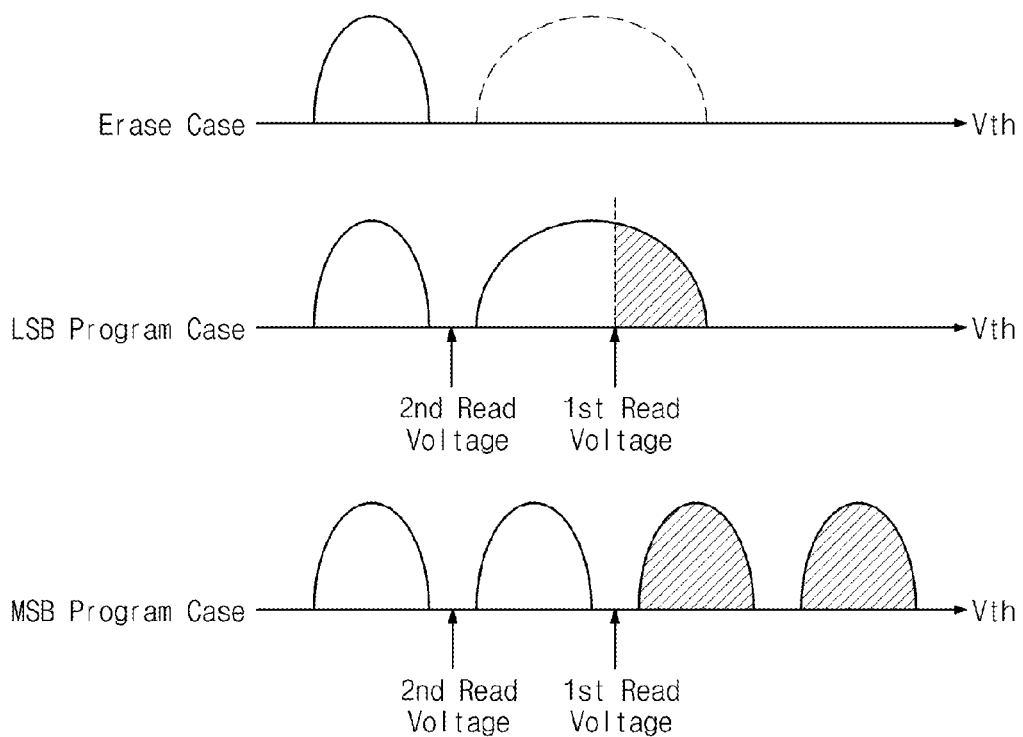
FIG. 3 is a diagram illustrating a method of reading LSB data from a nonvolatile memory device according to an embodiment of the inventive concept.

FIG. 3 is a diagram illustrating an LSB data read method of a nonvolatile memory device according to an embodiment of the inventive concept.

Referring to FIG. 3, when LSB data is read, nonvolatile memory device 100 counts selected memory cells having a threshold voltage higher than a first read voltage. In this example, the first read voltage is a voltage used to read LSB data of an MSB programmed page.

Where a first result value being a counted result value is larger than a first reference value, the selected memory cells may be determined to be MSB programmed. The first reference value may be determined on the basis of the number of memory cells having a threshold voltage higher than the first read voltage, from among memory cells of an LSB programmed page. In particular, the first reference value may be determined between the number of memory cells having a threshold voltage higher than the first read voltage among memory cells of an LSB programmed page, and the number of memory cells having a threshold voltage higher than the first read voltage among memory cells of an MSB programmed page.

For example, memory cells having a threshold voltage higher than the first read voltage among memory cells of an LSB programmed page may be about 15% to 20%. Also, memory cells having a threshold voltage higher than the first read voltage among memory cells of an MSB programmed page may be about 50%. In this case, the first reference value may be set to about 32.5% to 35%. Herein, "%" may indicate a ratio of memory cells having a threshold voltage higher than the first read voltage to selected memory cells.

Where the counted result value is larger than the first reference value, the selected memory cells may be determined to be MSB programmed. In this case, data read through page buffer 130 according to applying of the first read voltage to the selected memory cells may be output to input/output buffer 170 under the control of control logic 160. On the other hand, where the counted result value is smaller than the first reference value, the selected memory cells may be determined to be LSB programmed or in an erase state. In this case, to read LSB data, a second read voltage lower than the first read voltage may be applied to the selected memory cells (refer to an LSB program case).

Figure 4:
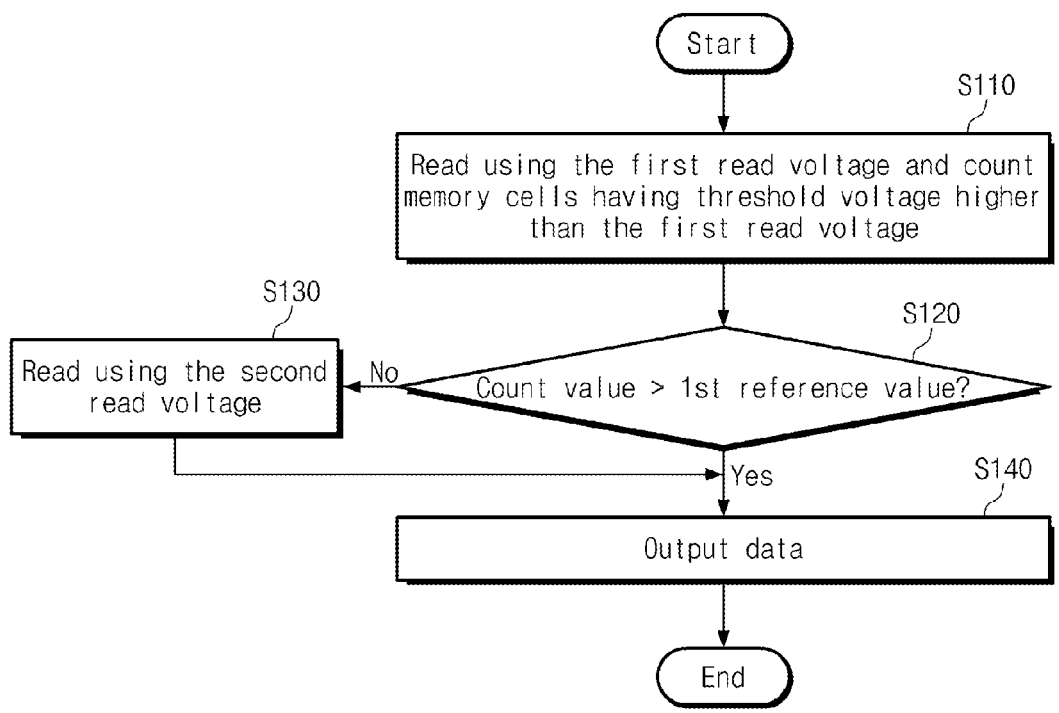
FIG. 4 is a flowchart illustrating a method of reading a nonvolatile memory device according to an embodiment of the inventive concept.

FIG. 4 is a flowchart illustrating a method of reading a nonvolatile memory device according to an embodiment of the inventive concept.

Referring to FIG. 4, the method comprises counting memory cells having a threshold voltage higher than a first read voltage, from among selected memory cells (S110), determining whether a result of the counting is larger than a first reference value to determine program states of the selected memory cells (S120), outputting data read using the first read voltage where the counted result value is larger than the first reference value (S130), and reading LSB data of the selected memory cells using a second read voltage lower than the first read voltage where the counted result value is smaller than the first reference value (S140).

Figure 5:
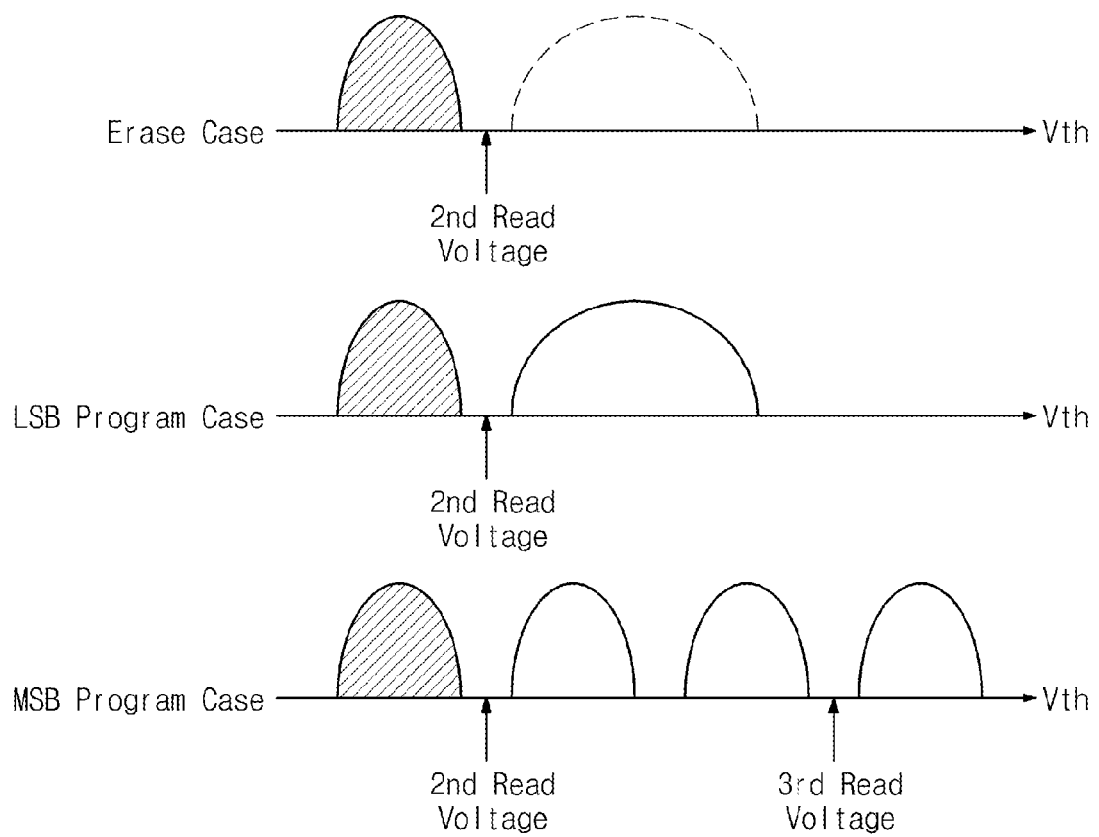
FIG. 5 is a diagram illustrating a method of reading MSB data from a nonvolatile memory device according to an embodiment of the inventive concept.

FIG. 5 is a diagram illustrating a method of reading MSB data in a nonvolatile memory device according to an embodiment of the inventive concept.

Referring to FIG. 5, where MSB data is read, nonvolatile memory device 100 counts memory cells having a threshold voltage lower than a second read voltage among selected memory cells. The second read voltage may be a voltage used to determine an erase state.

Where a second result value being a counted result value is smaller than a second reference value, the selected memory cells may be determined to be MSB programmed. The second reference value may be determined between the number of memory cells having an erase state, from among memory cells of an LSB programmed page and the number of memory cells having an erase state among memory cells of an MSB programmed page.

For example, the proportion of memory cells having an erase state among memory cells of an LSB programmed page may be about 50%. The proportion of memory cells having an erase state among memory cells of an MSB programmed page may be about 25%. In this case, the second reference value may be set to about 37.5%, for example. Herein, "%" may indicate a ratio of memory cells having a threshold voltage higher than the first read voltage to selected memory cells.

Where the counted result value is smaller than the second reference value, the selected memory cells may be determined to be MSB programmed. In this case, to read MSB data, a third read voltage higher than a second read voltage may be applied to the selected memory cells (refer to an MSB program case). Data read through a page buffer 130 according to the second and third read voltages may be output to an input/output buffer 170 under the control of control logic 160. On the other hand, where the counted result value is larger than the second reference value, the selected memory cells may be determined to be LSB programmed or in an erase state. In this case, a read operation according to an embodiment of the inventive concept may be performed once more.

Figure 6:
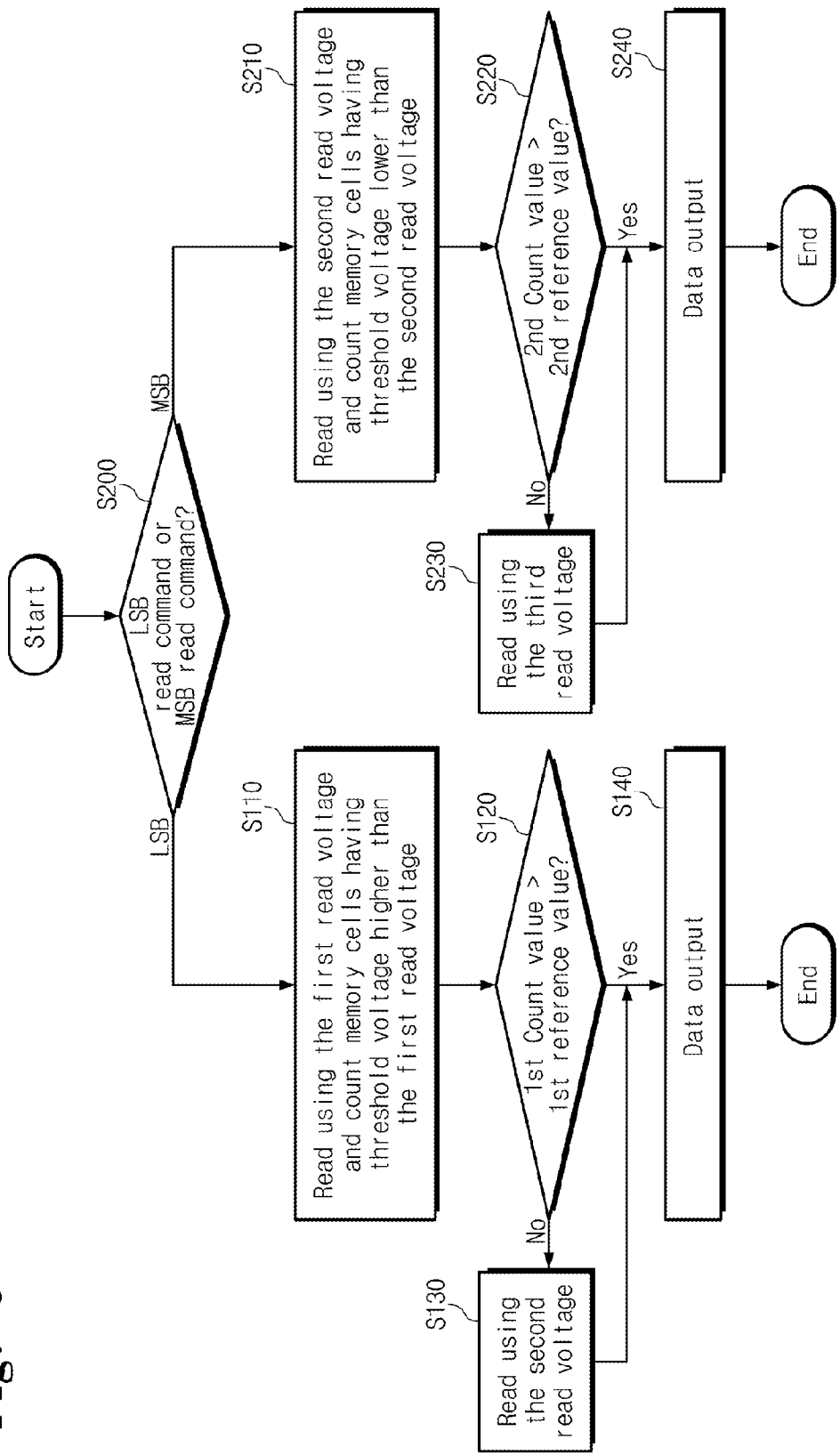
FIG. 6 is a flowchart illustrating a method of reading a nonvolatile memory device according to another embodiment of the inventive concept.

FIG. 6 is a flowchart illustrating a method of reading a nonvolatile memory device according to another embodiment of the inventive concept. Operations S110 to S140 in FIG. 6 may be performed substantially the same as operations S110 to S140 in FIG. 5, and a description thereof is therefore omitted.

Referring to FIG. 6, the method determines whether a command is an LSB data read command or an MSB data read command (S200). In the case of the MSB data read command, the method counts the number of memory cells having a threshold voltage lower than a second read voltage among selected memory cells (S210). Thereafter, a counted result value is compared with a second reference value to determine program states of the selected memory cells (S220). Where the counted result value is larger than the second reference value, data read using the second read voltage may be output (S230). If the counted result value is smaller than the second reference value, there may be read MSB data of the selected memory cells using a third read voltage higher than the second read voltage (S240). Meanwhile, in the case of an LSB data read command, operations S110 to S140 may be performed in the same manner as described in FIG. 5.

Figure 7:
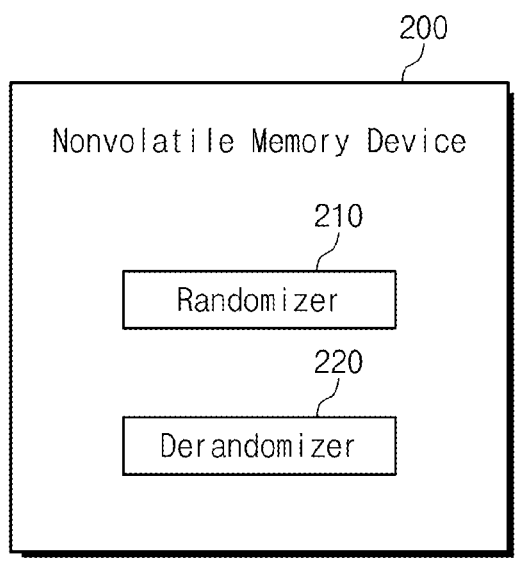
FIG. 7 is a block diagram illustrating a method of generating randomized data to be stored in a nonvolatile memory device according to an embodiment of the inventive concept.

FIG. 7 is a block diagram illustrating a randomized data generating method of a nonvolatile memory device according to an embodiment of the inventive concept.

Referring to FIG. 7, a nonvolatile memory device 200 may include a randomizer 210 and a derandomizer 220. Randomizer 210 is configured to change input data into randomized data using a seed value. Derandomizer 220 is configured to recover randomized data to original data using a seed value. Randomizer 210 and derandomizer 220 can be implemented by software or hardware.

With nonvolatile memory device 200, randomized data may be programmed in memory cells through randomizer 210 built in nonvolatile memory device 200, so that threshold voltage states of memory cells are distributed uniformly. That is, threshold voltage states may include the same number of memory cells.

Figure 8:
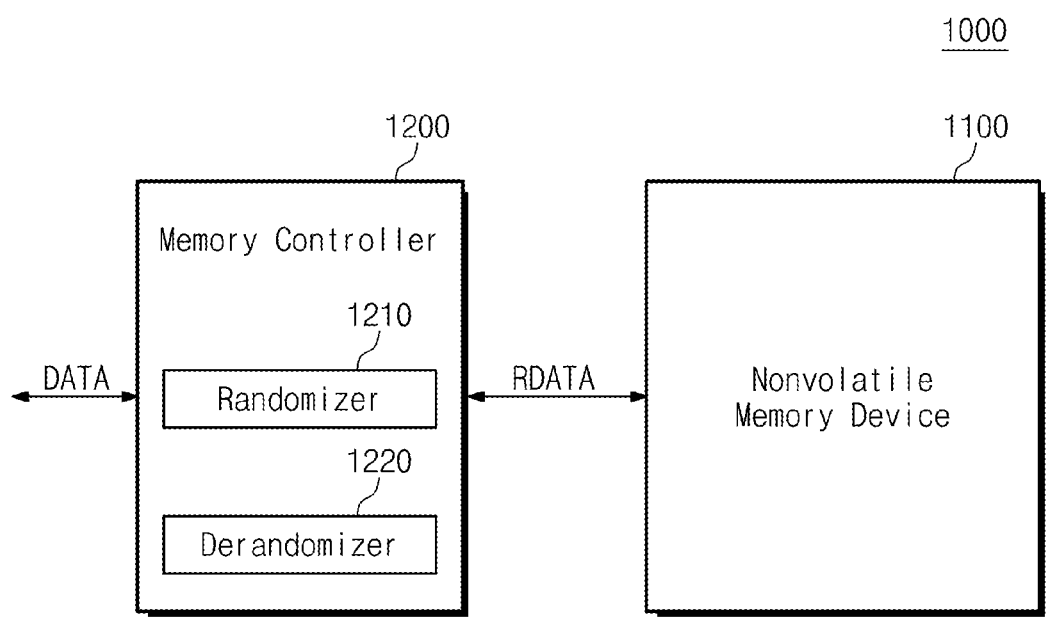
FIG. 8 is a block diagram illustrating a memory system according to an embodiment of the inventive concept.

FIG. 8 is a block diagram illustrating a memory system 1000 according to an embodiment of the inventive concept.

Referring to FIG. 8, memory system 1000 comprises a nonvolatile memory device 1100 and a memory controller 1200. Nonvolatile memory device 1100 may be the same or substantially the same as a nonvolatile memory device 100 in FIG. 1. Memory controller 1200 comprises a randomizer 1210 and a derandomizer 1220. As described with reference to FIG. 7, in memory system 1000, randomized data may be programmed at memory cells through randomizer 1210 built in memory controller 1200, so that threshold voltage states of memory cells are distributed uniformly. That is, threshold voltage states may include the same number of memory cells.

Similar to other embodiments described above, nonvolatile memory device 1100 may perform a read operation using a read voltage varied according to whether a page address corresponds to LSB data or MSB data. For example, where LSB data is read, nonvolatile memory device 1100 may count memory cells each having a threshold voltage higher than a first read voltage using data read through a page buffer when the first read voltage is applied to a memory cell array. Thereafter, program states of selected memory cells may be determined by comparing a first result value being a counted value with a first reference value.

Where MSB data is read, nonvolatile memory device 1100 may count memory cells having a threshold voltage lower than a second read voltage using data read through the page buffer when a second read voltage is applied to the memory cell array. Afterwards, program states of selected memory cells may be determined by comparing a second result value being a counted value with a second reference value.

Figure 9:
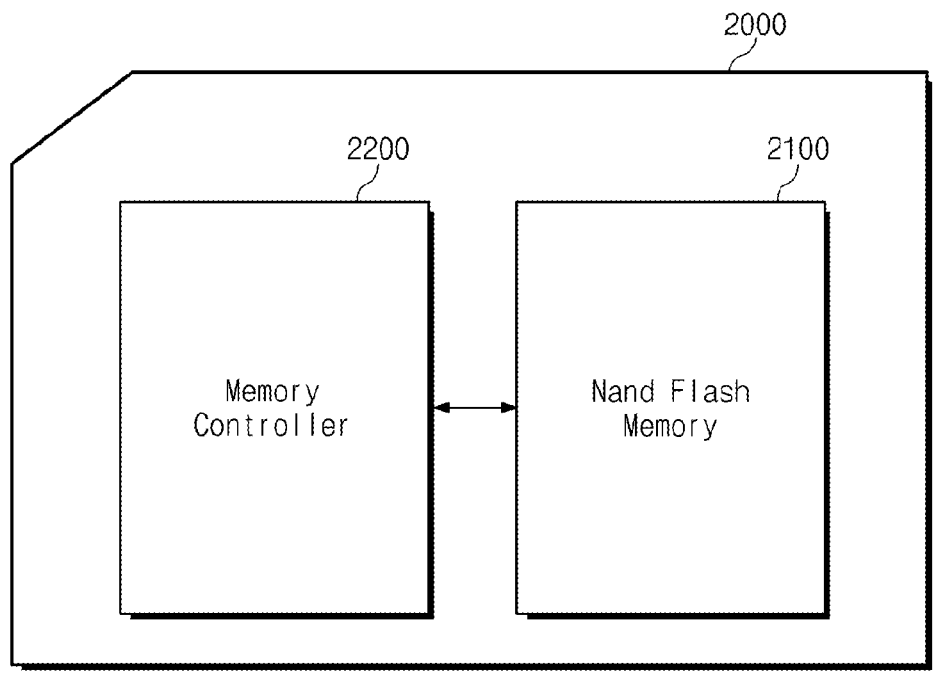
FIG. 9 is a block diagram illustrating a memory card according to an embodiment of the inventive concept.

FIG. 9 is a block diagram illustrating a memory card 2000 according to an embodiment of the inventive concept.

Referring to FIG. 9, memory card 2000 comprises a NAND flash memory device 2100 and a memory controller 2200 controlling NAND flash memory device 2100. NAND flash memory device 2100 is configured the same or substantially the same as a nonvolatile memory device 200 in FIG. 7. That is, NAND flash memory device 2100 may be configured to include a randomizer and a derandomizer Memory card 2000 may be, for instance, a multimedia card (MMC) or an SD card.

Figure 10:
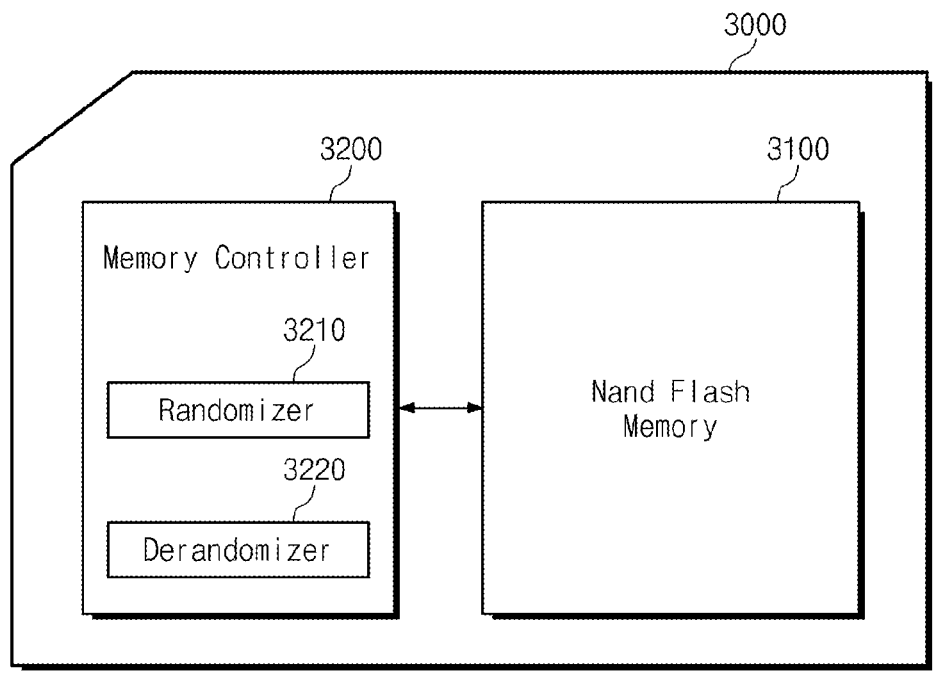
FIG. 10 is a block diagram illustrating a memory card according to another embodiment of the inventive concept

FIG. 10 is a block diagram illustrating a memory card 3000 according to another embodiment of the inventive concept.

Referring to FIG. 10, a memory card 3000 comprises a NAND flash memory device 3100 and a memory controller 3200 configured to control NAND flash memory device 3100. NAND flash memory device 2100 may be configured the same or substantially the same as a nonvolatile memory device illustrated in FIG. 1 or FIG. 7.

Memory controller 3200 comprises a randomizer 3210 and a derandomizer 3220 and may be configured the same or substantially the same as a memory controller 1200 of FIG. 8. Memory card 3000 may be, for instance, a multimedia card (MMC) or an SD card.

Figure 11:
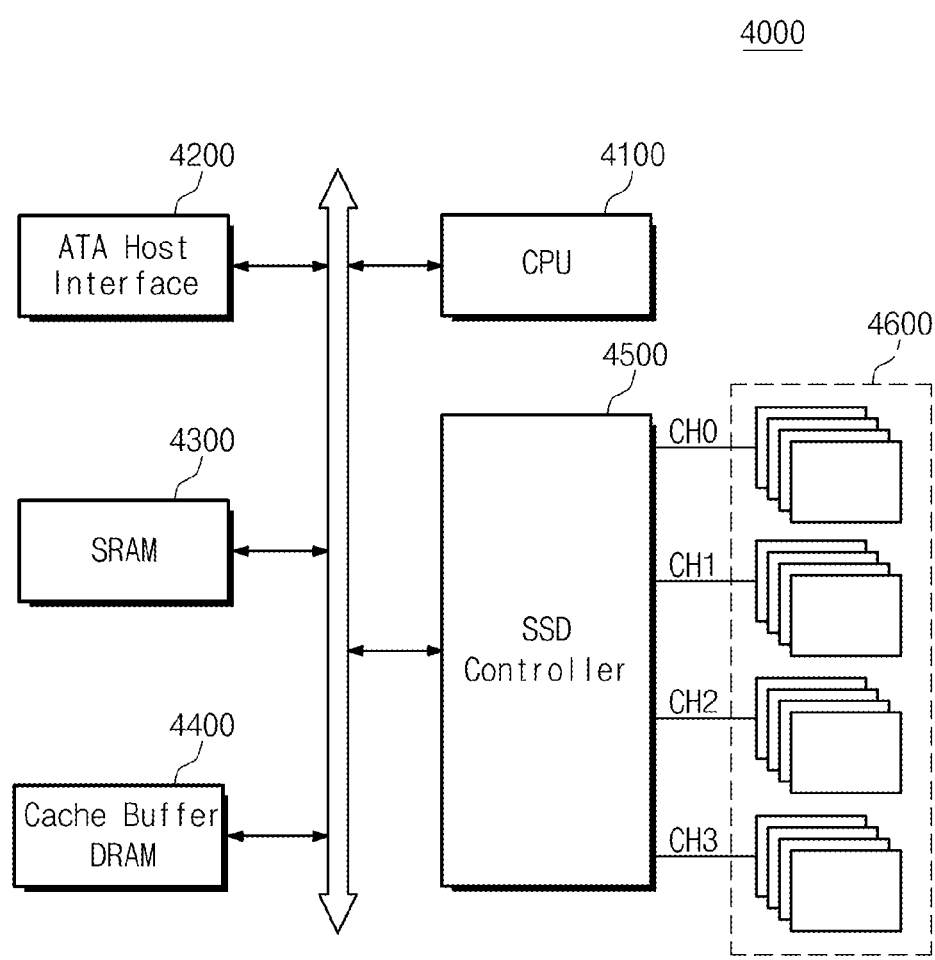
FIG. 11 is a block diagram illustrating a solid state drive according to an embodiment of the inventive concept.

FIG. 11 is a block diagram illustrating a solid state drive (SSD) 4000 according to an embodiment of the inventive concept. In general, various memory systems described herein may take the form of an SSD, and SSD 4000 is merely one such example.

Referring to FIG. 11, SSD 4000 comprises an SSD controller 4500 and a plurality of flash memories 4600. SSD controller 4500 may be configured the same or substantially the same as a memory controller 1200 in FIG. 8. Each of flash memories 4600 may be configured the same or substantially the same as a nonvolatile memory device 200 or 1100 in FIG. 7 or 8.

Referring to FIG. 11, a CPU 4100 receives a command from a host to determine whether to store data provided from the host at a flash memory or whether to read data of a flash memory to be transferred to the host. An ATA host interface 4200 exchanges data with the host under control of CPU 4100. ATA host interface 4200 receives a command and an address from the host to transfer them to CPU 4100. Herein, ATA host interface 4200 may be an SATA interface, a PATA interface, or an ESATA interface.

Data provided from the host or to be transferred to the host through ATA host interface 4200 is transferred to a cache buffer RAM 4400 without passing through a CPU bus according to a control of CPU 4100. A RAM 4300 is used temporarily to store data needed for an operation of SSD 4000. RAM 4300 may be formed of a DRAM, an SRAM, or a combination thereof.

Cache buffer RAM 4400 temporarily stores data transferred between the host and flash memories 4600. Also, cache buffer RAM 4400 may be used to store programs to be executed by CPU 4100. Cache buffer RAM 4400 may be a type of buffer memory, and may be formed of SRAM, for example.

SSD controller 4500 exchanges data with flash memories 4600 used for a storage device. SSD controller 4500 may be configured to support a One-NAND flash memory, a multi-level flash memory, a single level flash memory, and so on.

Meanwhile, CPU 4100 and SSD controller 4500 may be implemented by one ARM processor.

A memory system according to various embodiments of the inventive concept may be used as a mobile storage device. For example, the memory system according to the inventive concept may be used as mobile storage devices of MP3 players, digital cameras, PDAs, e-Book, and the like. Also, the memory system according to the inventive concept may be used as a storage device of a digital TV or a computer.

A memory system or a storage device according to various embodiments of the inventive concept may be packaged in various forms, such as e.g., Package on Package (PoP), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to selected embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of reading a nonvolatile memory device, comprising:
    applying a read voltage to a memory cell array to read selected memory cells;
    counting a number of the selected memory cells that have a threshold voltage higher or lower than the read voltage;
    comparing the counted number with a reference value to determine a number of bits stored in the selected memory cells,
    wherein the counting memory cells is performed with respect to at least one sector.

2. The method of claim 1, further comprising, based on the comparison, determining the selected memory cells to be in an erase state, a state in which a first logical page is programmed, or a state in which a second logical page is programmed.

3. The method of claim 1, wherein the selected memory cells store randomized data.

4. The method of claim 3, wherein the randomized data has a substantially uniform distribution of program states.

5. The method of claim 1, further comprising:
    using a first read voltage to read least significant bit (LSB) data from the selected memory cells upon determining that the number is greater than the reference value, and otherwise using a second read voltage to read LSB data from the selected memory cells.

6. The method of claim 1, further comprising:
    reading data from the selected memory cells using a voltage lower than the read voltage when the counted result value is smaller than the reference value; and
    otherwise outputting the read data where the counted result value is larger than the reference value,
    wherein the reference value is determined on the basis of the number of memory cells having a threshold voltage higher than the read voltage among memory cells of a first logical page programmed.

7. The method of claim 6, wherein where the counted result value is smaller than the reference value, the selected memory cells are determined to be in an erase state or in a state in which the first logical page is programmed.

8. The method of claim 7, wherein where the counted result value is larger than the reference value, the selected memory cells are determined to be in a state in which two logical pages are programmed.

9. The method of claim 7, wherein the reference value is determined between the number of memory cells having a threshold voltage higher than the read voltage among the memory cells of the first logical page and the number of memory cells having a threshold voltage higher than the read voltage among the memory cells of the second logical page.

10. A method of reading a nonvolatile memory device, comprising:
    performing a read operation on data programmed in a first logical page corresponding to a page address, the read operation comprising counting a number of memory cells having a threshold voltage higher than a first read voltage among selected memory cells to produce a first counting result and determining a number of bits programmed in the selected memory cells by comparing the first counting result with a first reference value; and
    performing a read operation on data programmed in a second logical page corresponding to a page address, the read operation comprising counting memory cells having a threshold voltage lower than a second read voltage among the selected memory cells to produce a second counting result and determining a number of bits programmed in the selected memory cells by comparing the second counting result with a second reference value,
    wherein the second read voltage is lower than the first read voltage, the first reference value is determined on the basis of the number of memory cells having a threshold voltage higher than the first read voltage among memory cells of a first logical page programmed, and the second reference value is determined on the basis of the number of memory cells having an erase state among memory cells of the first logical page programmed and a second logical page programmed.

11. The method of claim 10, wherein the first reference value is determined between the number of memory cells having a threshold voltage higher than the first read voltage among the memory cells of the first logical page programmed and the number of memory cells having a threshold voltage higher than the first read voltage among the memory cells of the second logical page programmed.

12. The method of claim 10, wherein where the second result value is larger than the second reference value, the selected memory cells are determined to be in an erase state or in a state where the first logical page is programmed.

13. The method of claim 12, wherein where the second result value is smaller than the second reference value, the selected memory cells are determined to be a state in which the second logical page is programmed.

14. The method of claim 13, further comprising reading data using a third read voltage higher than the first and second read voltages.

15. A nonvolatile memory device, comprising:
a memory cell array comprising a plurality of memory cells;
a page buffer configured to read data from the memory cell array or to write data in the memory cell array;
a counter configured to count on cells or off cells among selected memory cells using data read via the page buffer;
judge logic configured to compare a result of the counting performed by the counter with a reference value; and
control logic configured to control a read voltage used in a read operation according to the comparison performed by the judge logic,
wherein the off cells are memory cells having respective threshold voltages higher than a first read voltage, the on cells are memory cells having respective threshold voltages lower than a second read voltage, and the second read voltage is lower than the first read voltage.

16. The nonvolatile memory device of claim 15, wherein the reference value comprises a first reference value determined between the number of memory cells having a threshold voltage higher than the first read voltage among memory cells of a first logical page programmed and the number of memory cells having a threshold voltage higher than the first read voltage among memory cells of a second logical page programmed; and
a second reference value determined between the number of memory cells having a threshold voltage lower than the second read voltage among the memory cells of the first logical page programmed and the number of memory cells having a threshold voltage lower than the second read voltage among the memory cells of the second logical page programmed.

17. The nonvolatile memory device of claim 15, wherein the selected memory cells store randomized data.

18. The nonvolatile memory device of claim 17, wherein the randomized data has a substantially uniform distribution of program states.

19. The nonvolatile memory device of claim 15, wherein the control logic controls the read voltage to have a first value or a second value to read least significant bit (LSB) data from the selected memory cells according to the comparison performed by the judge logic.

* * * * *